United States Patent
Yuan et al.

(10) Patent No.: US 7,361,986 B2
(45) Date of Patent: Apr. 22, 2008

(54) HEAT STUD FOR STACKED CHIP PACKAGE

(75) Inventors: Tsorng-Dih Yuan, Hopewell Junction, NY (US); Hsin-Yu Pan, Taipei (TW); Chung-Yi Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/001,385

(22) Filed: Dec. 1, 2004

(65) Prior Publication Data

US 2006/0113663 A1 Jun. 1, 2006

(51) Int. Cl.
*H01L 23/06* (2006.01)

(52) U.S. Cl. ............ 257/718; 257/712; 257/719; 257/713; 257/675; 257/723; 257/778

(58) Field of Classification Search ............ 257/718, 257/712, 713, 719, 675, 723, 778
See application file for complete search history.

(56) References Cited

U.S. PATENT DOCUMENTS

| | | | |
|---|---|---|---|
| 5,396,403 A | 3/1995 | Patel | |
| 6,093,961 A | 7/2000 | McCullough | |
| 6,265,771 B1 * | 7/2001 | Ference et al. | 257/686 |
| 6,472,741 B1 * | 10/2002 | Chen et al. | 257/712 |
| 6,774,478 B2 | 8/2004 | Eto et al. | |
| 6,906,416 B2 * | 6/2005 | Karnezos | 257/723 |
| 7,034,388 B2 * | 4/2006 | Yang et al. | 257/686 |
| 2004/0037043 A1 | 2/2004 | Ku | |
| 2004/0113265 A1 | 6/2004 | Karnezos | |
| 2004/0195667 A1 * | 10/2004 | Karnezos | 257/686 |
| 2006/0012018 A1 * | 1/2006 | Karnezos et al. | 257/678 |

* cited by examiner

*Primary Examiner*—Junghwa Im
(74) *Attorney, Agent, or Firm*—Slater & Matsil, L.L.P.

(57) ABSTRACT

A semiconductor package assembly is presented. The assembly comprises a first chip and a second chip. The back surfaces of the first and the second chips are thermally attached through a die attach material. The front surface of the first chip is attached to a substrate through bumps. A heat spreader extends from a surface of the semiconductor package assembly into the semiconductor package assembly and thermally attaches to the back surface of the first chip or the front surface of the second chip. Depending on the sizes of the chips and the location of the bonding pads, the heat spreader may be attached to the back surface of the first chip or the front surface of the second chip.

14 Claims, 4 Drawing Sheets

HEAT STUD FOR STACKED CHIP PACKAGE

TECHNICAL FIELD

This invention relates generally to integrated circuit packaging, more particularly to a method of dissipating heat generated from stacked die package assemblies.

BACKGROUND

Semiconductor apparatuses have come to be used in a state where semiconductor chips are stacked in order to increase packaging densities, in many cases. A conventional stacked chip semiconductor package has a stacked structure made by stacking a plurality of units. Each unit includes a semiconductor chip, a circuit board having the semiconductor chip mounted thereon, and a frame-shaped insulating substrate which has a chip cavity and which is mounted on the circuit board. The stacked structure in which the plurality of units is stacked is sandwiched by two insulating substrates, and then the resultant structure is made monolithic, thus forming the semiconductor package. A required number of external connection terminals made of solder balls or the like are formed on an outer surface of one insulating substrate. The external terminals are electrically connected to electrodes of the semiconductor chips, respectively, through electrically conductive vias formed in the insulating substrates.

Adoption of such a stacked semiconductor package realizes a smaller semiconductor apparatus with higher density. However, since a smaller semiconductor apparatus has a structure with such high-density integration of semiconductor chips, heat is more apt to be generated.

A high temperature of a semiconductor chip harmfully affects operations and reliability of the semiconductor device. Particularly in a semiconductor memory such as a dynamic random access read write memory (DRAM), a high temperature causes deterioration in memory retention characteristics. Accordingly, in stacked semiconductor packages, heat radiation measures are required.

Another limitation is the low power dissipation of the package. The heat is transmitted from one die to the other and there is no significant dissipation path other than through the solder ball to the motherboard. Heat sinks are designed to solve this problem. FIG. 1 illustrates a conventional package assembly 1 having a heat sink 8. Flip chip 6 is connected to substrate 2 through bumps 4. A heat sink 8 typically formed of a metal with good heat conductance is attached to the back surface of the flip chip 6. Heat sink 8 has a surface exposed to outside of the package assembly 1. Heat generated by chip 6 is conducted to the heat sink 8 and then dissipated to outside.

When chips are stacked and packaged, heat dissipation is more complicated. Existing applications either has no thermal enhancement implemented, or use wire bond package in order to apply heat-dissipating device. FIG. 2 illustrates a stacked chip package 9. Chips 14 and 22 are wire bonded to a substrate 10. A heat sink 26 is attached to substrate 24. Chip 22 faces down and is wire bonded. Substrate 24 is wire bonded to chip 22 by wires. Wires 28 connect to substrate 10 through substrate 24. A supporting frame 18 supports the chip 22 and substrate 24. It is noted that due to the clearance space needed by wires 16, 28 and supporting frame 18, chip 14 is relatively far away from the heat sink 26. Heat generated by chip 14 has to go through thick layers of module encapsulation 20, then chip 22 and substrate 24 before it reaches heat sink 26. This greatly limits heat dissipation capability to less than about one to two watts per package.

Heat can also be dissipated through substrates. Heat sink may also be attached to substrate that has a flip chip attached. Copper traces can be embedded in the substrate to improve heat conductance. Since substrate has ball grid array balls locating on the same side the heat sink is attached, the space available to heat sink is limited. Also, substrates have limited heat dissipating capability due to material limitations.

As technology advances, packages are more condensed, and frequency goes higher. These all increase heat generated per unit volume of the semiconductor packages. Therefore, there is the need for better heat dissipation scheme.

SUMMARY OF THE INVENTION

The preferred embodiment of the present invention presents a semiconductor package assembly.

The assembly comprises a first chip having a front surface with bonding pads, a second chip having a front surface with bonding pads. The back surface of the first chip and the back surfaces of the first and the second chips are thermally attached through a die attach material. The front surface of the first chip is attached to a substrate through bumps. A heat spreader extends from a surface of the semiconductor package assembly into the semiconductor package assembly.

In accordance with one aspect of the present invention, the second chip has a central front surface region free of bonding pads, the heat spreader attaches to the front surface of the second chip.

In accordance with another aspect of the present invention, the second chip is substantially smaller than the first chip and the bonding pads are close to one edge, the second chip is attached to one side or one corner the first chip. The heat spreader attaches to the back surface of the first chip.

The preferred embodiments of the present invention take the geometry structure of the stacked chip into consideration. Heat spreaders are put as close to heat generating devices as possible. Bigger interface areas are desired. Therefore the heat dissipation is significantly improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiments, thermal and mechanical performance can be evaluated through professional engineering analysis and will be evaluated when needed to identify the optimal dimensions and material selection. Certain general principles are applied when determining an optimal solution. It is known that heat dissipation from one point to another is affected by several factors. Assume a first region of a device is at a higher temperature $T_1$, a second region of the device is at a lower temperature $T_2$, the distance between the first and the second regions is D, then the heat dissipation rate, which is the heat transferred during a unit time, increases when the temperature gradient that is defined as $(T_1-T_2)/D$ increases, and when the heat dissipating area increases. Therefore, if the temperature difference $(T_1-T_2)$ is higher, and/or the distance D is shorter, the heat dissipation rate is higher. Increasing $(T_1-T_2)$ can be achieved by lowering $T_2$, and can be done by provide better cooling for any part of surrounding a heat generating device. Therefore it is preferred that the heat sink, or heat spreader is as close to the heat generating device as possible. It is also preferred that the area interfacing two regions is big so that the heat resistance is low. The preferred embodiments of the present invention apply these principles.

Figure 3:
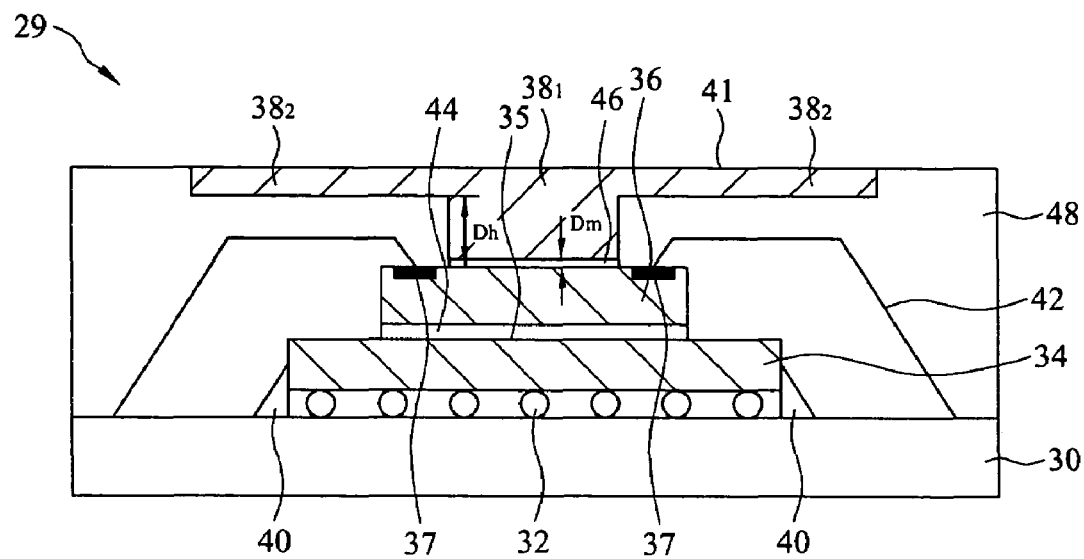
FIG. 3 illustrates a cross-sectional view of a preferred embodiment of the present invention, a heat spreader is attached to the front surface of a chip.

FIG. 3 illustrates a cross-sectional view of a preferred embodiment of the present invention. A flip chip 34 is assembled to a substrate 30 through bumps 32. Underfill 40 helps supporting chip 36. A second chip 36 has pads formed around the parameter of the chip, leaving the central region free of pads. The second chip 36 is attached to the back surface 35 of the flip chip 34 by a die attach material 44, such as an epoxy adhesive comprising silver and aluminum. Die attach material 44 preferably has good heat conductance and can be materials such as Hysol or Ablestik non-conductive epoxy. The size of chip 36 may be smaller, equal or greater than the size of chip 34. Chip 36 is connected to substrate 30 through bonding pads 37 and wires 42. A heat spreader 38 is formed on chip 36. Heat spreader has two ends, a heat dissipating end, which dissipates heat out of the package and a heat-collecting end, which takes heat into the spreader. Heat spreader 38 has a main portion $38_1$ and an extension $38_2$ at the heat dissipating end extending along the surface of the package assembly 29 in order to increase cooling area. Heat spreader 38 interfaces with the central region of the chip 36, where there is no pad. In the preferred embodiment, heat spreader 38 attaches to chip 36 through a molding compound 46. The preferred thickness $D_m$ of the molding compound is about 25 µm to about 100 µm. Molding compound 46 is preferably Sumitomo G770 series mold compound. In order to prevent the heat spreader extension $38_2$ and wires 42 from touching, heat spreader extension $38_2$ and wires 42 have a clearance height $D_h$. The clearance height $D_h$ depends on the height of wires 42. Enough space has to be left so that wires do not touch heat spreader 38 from above. The distance $D_h$ is preferably about 100 to about 500 µm. Heat spread $38_1$ has a preferred thickness of between about 300 µm and 500 µm and the extension $38_2$ has a preferred thickness of between about 100 µm and 200 µm.

Heat spreader 38 preferably comprises copper graphite or other metal alloys. It is preferably pre-molded and assembled to the package assembly. Molding compound 48 holds the chips, wires and heat spreader in place. It also conducts heat therefore good conductance is preferred.

Figure 1:
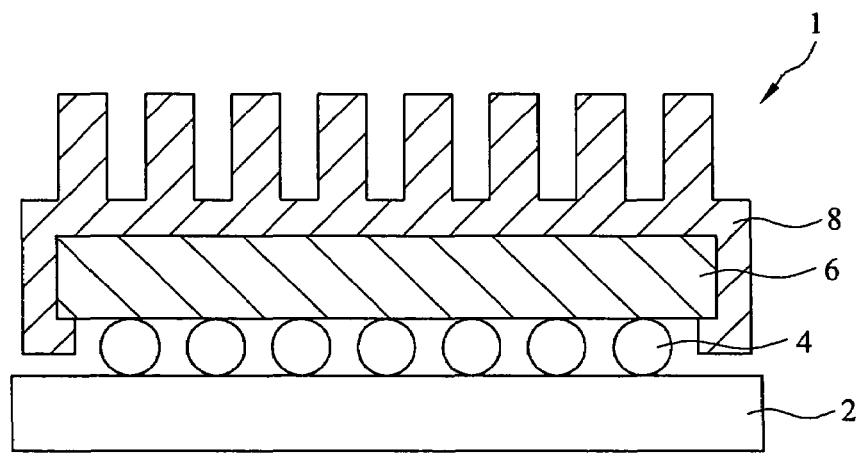
FIG. 1 illustrates a cross-sectional view of a conventional package assembly having a flip chip and a heat sink.
Figure 2:
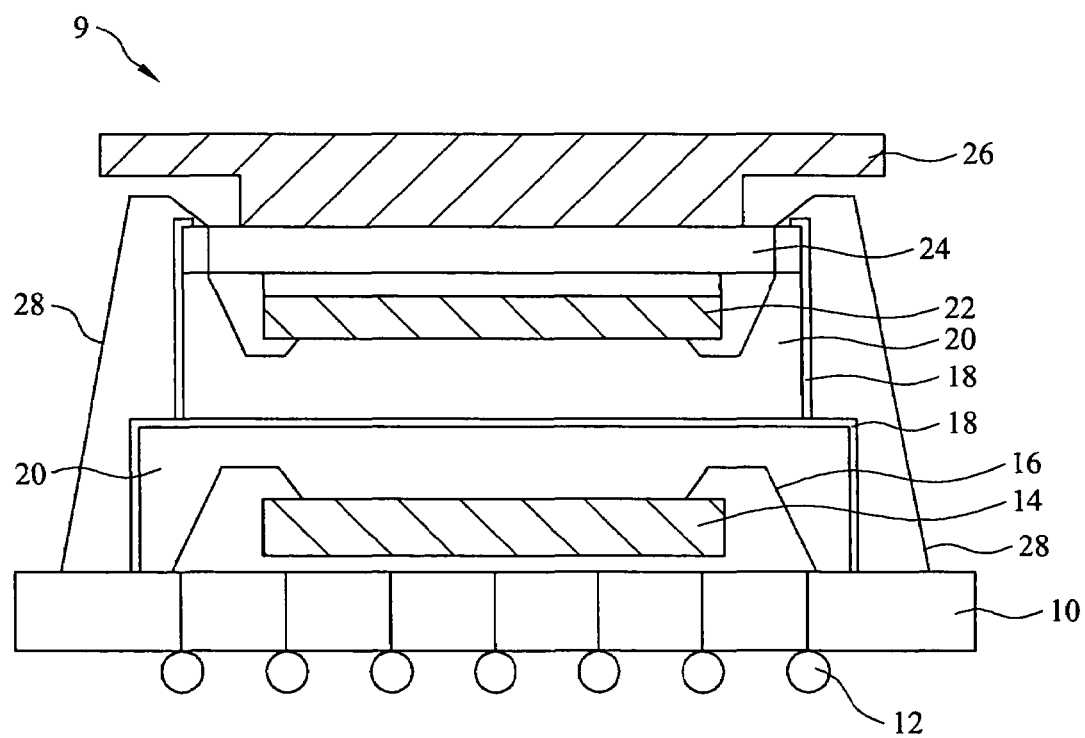
FIG. 2 illustrates a cross-sectional view of a conventional package assembly having stacked chips and a heat sink.

Comparing to the prior art in FIG. 2, chip 36 couples to heat spreader 38 through a very thin molding compound 46. Therefore, chip 36 has a low heat-resistance path for it to dissipate heat. Since better cooling for chip 36 lowers its temperature, and the distance between chips 34 and 36 is minimized, the temperature gradient is increased due to higher temperature difference and shorter distance. Therefore chip 34 has a better path to dissipate heat toward chip 36.

Figure 4:
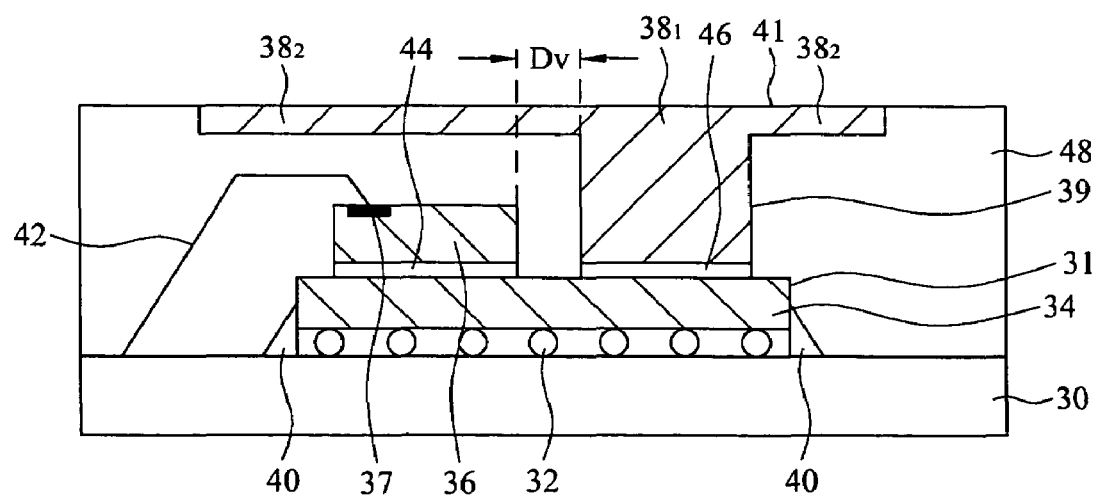
FIG. 4 illustrates a cross-sectional view of another preferred embodiment of the present invention, a heat spreader is attached to the back surface of a flip chip.

FIG. 4 illustrates a cross-sectional view of another preferred embodiment of the present invention. This embodiment handles case that chips stacked into packages assemblies have different sizes. In this embodiment, chip 36 is smaller than chip 34, and only one side of the chip 36 has bonding pads 37 and wires 42. Engineering evaluation has revealed that it is desirable that chip 36 is assembled to one side of the chip 34 instead of the center so that a space is left on the backside of the flip chip 34. A heat spreader 38 is attached to the chip 34. In the preferred embodiment, a molding compound 46 is left between heat spreader 38 and flip chip 34. The molding compound 46 preferably has a thickness of about 50 µm and about 100 µm. A clearance distance $D_v$ is left between heat spreader 38 and chip 36. Preferably the clearance distance $D_v$ is between about 100 µm and about 200 µm. On the other side of the chip 36, the edge 39 of the heat spreader 38 may be recessed, extended or aligned with the edge 31 of chip 34.

Figure 5:
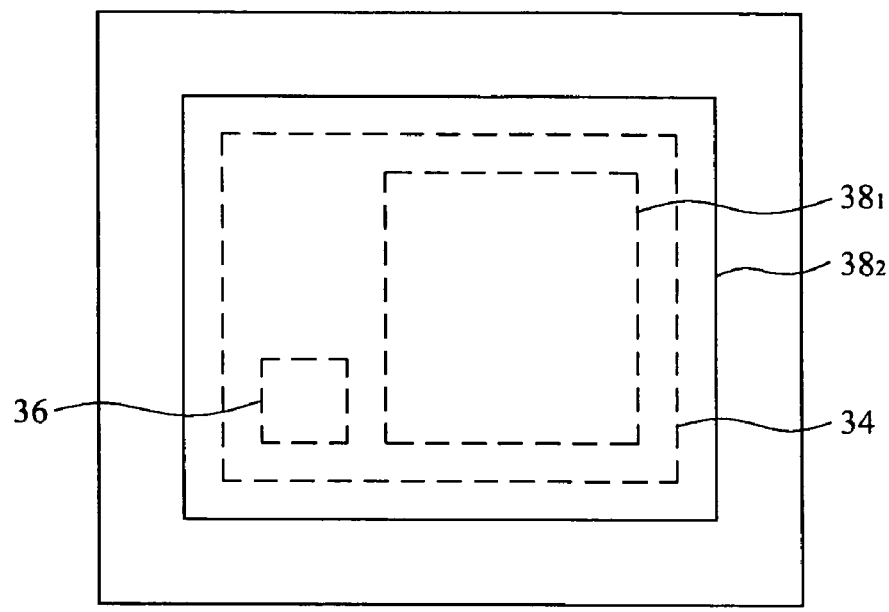
FIGS. 5, 6 and 7 illustrate top views of the variations of the preferred embodiment of the present invention.
Figure 6:
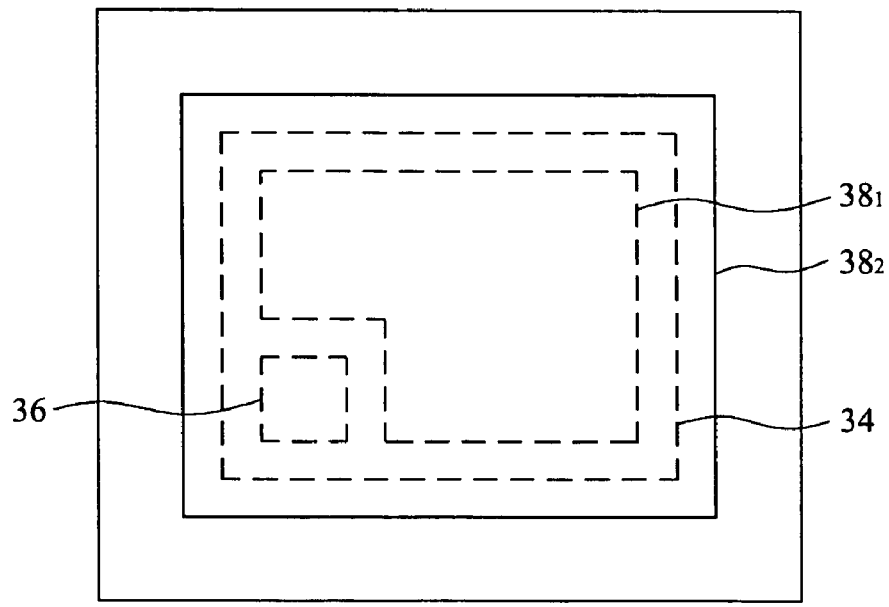

FIG. 5 illustrates a top view of one variation of the embodiment in FIG. 4. Corresponding elements can be identified by their numbers by comparing to FIG. 4. The main heat spreader portion $38_1$ is rectangle shaped and chip 36 can be assembled at any location of the remaining space. FIG. 6 illustrates a top view of another variation of the embodiment in FIG. 4. Chip 36 is pushed to a corner of the chip 34. The main portion of the heat spreader $38_1$ partially encloses chip 36 from two directions. With such a design, heat spreader 38 and chip 34 has more interface area. This provides better heat dissipation for chip 34. However, comparing to the variation in FIG. 5, better precision is required for assembling.

The heat spreader 38 has a surface 41 exposed to outside of the package assembly. In various embodiments, heat spreader 38 can be attached to an external heat sink for more advanced cooling. Heat spreader can also have different shape for better heat dissipation.

Figure 7:
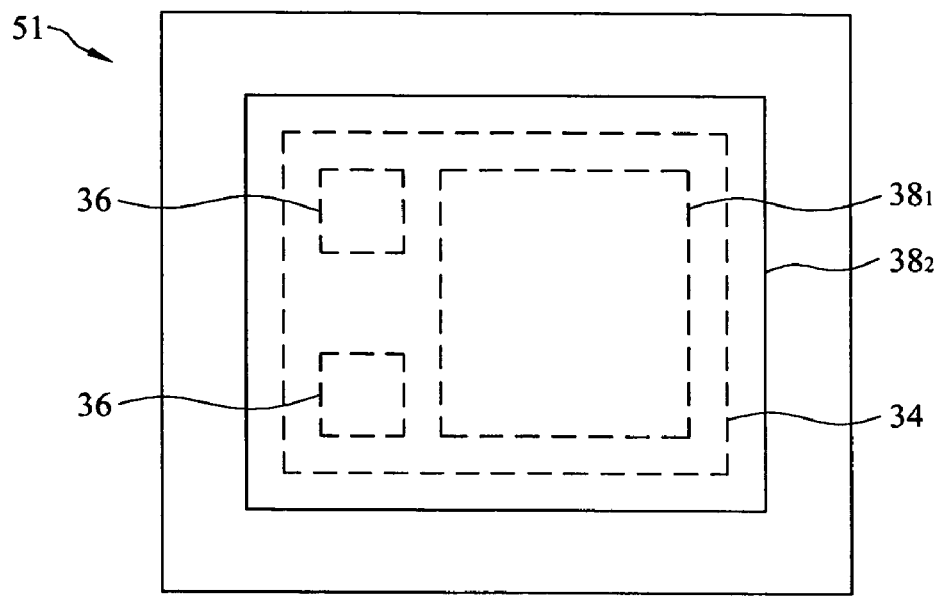

In alternative embodiments of the present invention, more chips can be assembled. FIG. 7 illustrates a top view of a package assembly 51 with 3 chips assembled. Chip 34 has bigger area and is assembled as a flip chip. Chips 36 are smaller therefore occupies a portion of the back surface of the flip chip 34. A heat spreader 38 goes into the assembly 51 and interfaces flip chip 34 directly. The heat spreader 38 not only draws heat from the otherwise deeply buried chip 34, it also picks up heat from chips 36. Therefore, lowers temperature for spots that may overheat.

Figure 8:
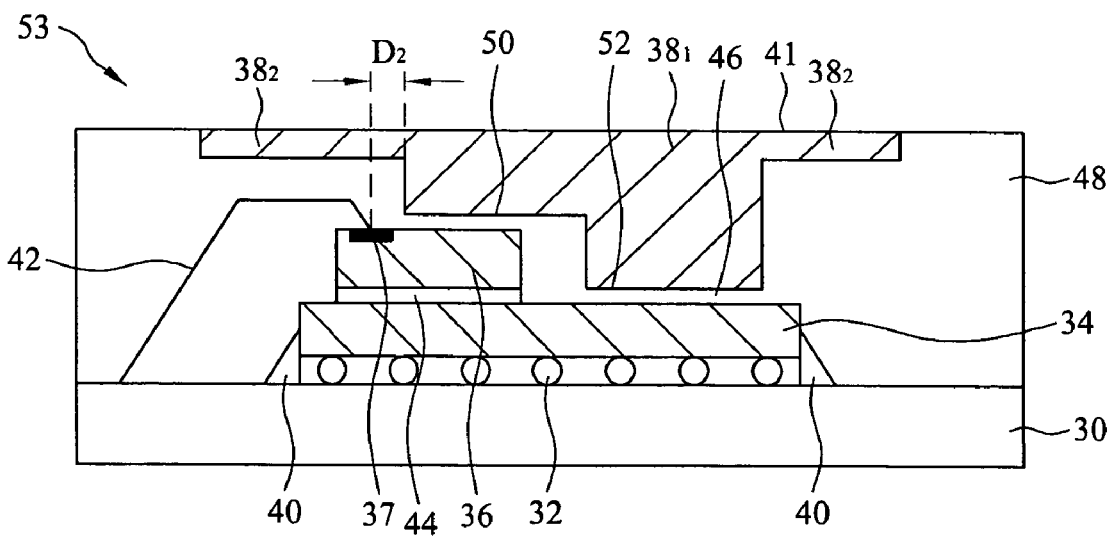
FIG. 8 illustrates a variation of the preferred embodiment of the present invention, wherein a heat spreader is assembled close to two chips.

FIG. 8 illustrates a variation of the embodiment illustrated in FIG. 4. Besides the first surface 52 interfacing the flip chip 34, the heat spreader 38 has a second surface 50 close to the chip 36. Chip 36 now has a second low heat-resistance path. It is preferred that the second surface 50 is close to the wire 42 so that the interface area of surface 50 is great. Preferably, the distance $D_2$ is between about 100 µm to about 200 µm.

The distance between interface 50 and the chip 36 is preferably between about 50 µm and about 100 µm. However, lower distance increases the difficulty of packaging process.

By using the design principles discussed in previous paragraphs, an embodiment can be determined by the designer with the engineering considerations of the size, shape, heat generating power, etc. The preferred embodiments of the present invention take into consideration of the geometry structure of the stacked chip. Heat spreaders are put as close to heat generating devices as possible. Bigger heat dissipating areas are achieved. Therefore the heat dissipation is significantly improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package assembly comprising:
a substrate;
a first chip having a back surface, the first chip being flip assembled to the substrate through bumps;
a second chip over the back surface of the first chip with a back surface of the second chip facing the back surface of the first chip, wherein the second chip is smaller than the first chip; and
a heat spreader thermally coupled to the first chip, the heat spreader having a heat-collecting end and a heat dissipating end, wherein a surface of the heat-collecting end overlaps the back surface of the first chip, and wherein a first vertical distance between the heat-collecting end and the back surface of the first chip is substantially smaller than a second vertical distance between the heat-collecting end and a front surface of the second chip.

2. The semiconductor package assembly of claim 1 wherein the second chip has bonding pads close to an edge of the second chip.

3. The semiconductor package assembly of claim 1 wherein the heat spreader and the first chip are separated by a layer of molding compound having a thickness of between about 25 µm and about 100 µm.

4. The semiconductor package assembly of claim 1 wherein the heat spreader has an extension extending directly over the second chip, and wherein a bottom surface of the extension is not co-planar to the heat dissipating end, and wherein a third vertical distance between the bottom surface of the extension and the front surface of the second chip is substantially close to the first vertical distance.

5. The semiconductor package assembly of claim 4 wherein the extension of the heat spreader has a thickness of between about 100 µm and about 200 µm.

6. A semiconductor package assembly comprising:
a first chip having a front surface with bonding pads and a back surface;
a second chip having a front surface with bonding pads and a back surface, wherein the second chip is smaller than the first chip;
the back surface of the first chip and the back surface of the second chip being overlapped and separated only by an adhesive;
the front surface of the first chip being attached to a substrate through bumps; and
a heat spreader extending from a surface of the semiconductor package assembly into the semiconductor package assembly, wherein the heat spreader comprises a heat-collecting end having a first surface thermally coupled to the back surface of the first chip, and a second surface thermally coupled to only a portion of the front surface of the second chip.

7. The semiconductor package assembly of claim 6 wherein the heat-collecting end of the heat spreader is separated from the back surface of the first chip and the front surface of the second chip only by a molding compound having a thickness of less than about 100 µm.

8. The semiconductor package assembly of claim 6 wherein the second chip has bonding pads located close to an edge of the second chip and wherein the second surface of the heat-collecting end extends over a central region of the front surface of the second chip.

9. The semiconductor package assembly of claim 8 wherein the second chip is aligned close to an edge of the first chip.

10. The semiconductor package assembly of claim 6 further comprising a third chip, wherein a back surface of the third chip is attached to the back surface of the first chip, and wherein the third chip comprises bonding pads located close to an edge of a front surface of the third chip, and wherein the heat-collecting end of the heat spreader is thermally coupled to the front surface of the third chip.

11. The semiconductor package assembly of claim 1 wherein the back surface of the first chip is free of conductive pads.

12. The semiconductor package assembly of claim 11 wherein the back surface of the second chip is free of conductive pads.

13. The semiconductor package assembly of claim 6 wherein the back surface of the first chip is free of conductive pads.

14. The semiconductor package assembly of claim 13 wherein the back surface of the second chip is free of conductive pads.

* * * * *